United States Patent
Tsugane et al.

(10) Patent No.: US 7,158,055 B2
(45) Date of Patent: *Jan. 2, 2007

(54) KEY INPUT CIRCUIT, POWER SUPPLY CONTROL APPARATUS, AND POWER SUPPLY CONTROL METHOD

(75) Inventors: Hideshi Tsugane, Yokohama (JP); Hironobu Sasaki, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 435 days.

This patent is subject to a terminal disclaimer.

(21) Appl. No.: 10/688,597

(22) Filed: Oct. 17, 2003

(65) Prior Publication Data

US 2004/0084969 A1    May 6, 2004

Related U.S. Application Data

(63) Continuation of application No. 09/669,168, filed on Sep. 25, 2000, now Pat. No. 6,686,671.

(30) Foreign Application Priority Data

Sep. 28, 1999    (JP) ................. 11-275309

(51) Int. Cl.
H03K 17/94    (2006.01)

(52) U.S. Cl. .................. 341/26; 341/22; 713/340

(58) Field of Classification Search ............... 341/22, 341/26; 713/340
See application file for complete search history.

(56) References Cited

U.S. PATENT DOCUMENTS

| | | | |
|---|---|---|---|
| 4,318,087 A | 3/1982 | Wilson | |
| 4,518,951 A | 5/1985 | Backes | 178/17 C |
| 4,570,154 A | 2/1986 | Kinghorn et al. | 341/26 |
| 4,667,181 A | 5/1987 | Hastreiter | 341/26 |
| 4,878,056 A | 10/1989 | Isoda et al. | 341/25 |
| 4,906,993 A | 3/1990 | Freeman et al. | 341/22 |
| 5,189,543 A | 2/1993 | Lin et al. | 359/142 |
| 5,384,721 A | 1/1995 | Joto | 341/26 |
| 5,402,121 A | 3/1995 | Noorbehesht | 341/22 |
| 5,554,985 A | 9/1996 | Chang | 341/22 |
| 5,574,891 A | 11/1996 | Hsu et al. | 345/168 |

(Continued)

FOREIGN PATENT DOCUMENTS

DE    33 23 285 A    1/1985

OTHER PUBLICATIONS

IBM Technical Disclosure Bulletin, vol. 33, No. 5; Oct. 1990; pp. 237-238; Interface of a Low-Power Keyboard for Lap-Top Computers.

*Primary Examiner*—Timothy Edwards, Jr.
(74) *Attorney, Agent, or Firm*—Pearne & Gordon LLP

(57) ABSTRACT

A key switch 102 formed by arranging a plurality of key contacts SW11, SW12, SW21, SW22, . . . at cross points of a key matrix is provided with a power supply control key (SW11), and a key scan circuit 101 for detecting open/close states of the plural key contacts of the key switch 102 is independently arranged from a power supply control key state detecting means for detecting the open/close state of the contact SW11 of the power supply control key. The depression of the power supply control key (SW11) is detected by the power supply control key state detecting means. When the operation is ended, or the power supply is turned OFF, the depression of the power supply control key is detected by the key scan circuit 101, and the supply of the electric power is stopped.

3 Claims, 2 Drawing Sheets

U.S. PATENT DOCUMENTS

| | | | |
|---|---|---|---|
| 5,629,694 A | 5/1997 | Simon et al. ................ 341/22 |
| 5,635,958 A | 6/1997 | Murai et al. ................ 341/22 |
| 5,702,625 A | 12/1997 | Choi ........................ 219/506 |
| 5,805,085 A | 9/1998 | Hsu et al. |
| 5,859,599 A * | 1/1999 | Shiga ........................ 341/21 |
| 5,861,822 A | 1/1999 | Park et al. ................ 341/176 |
| 5,898,425 A | 4/1999 | Sekine ...................... 345/168 |
| 6,072,472 A | 6/2000 | Shiga ........................ 341/22 |
| 6,181,262 B1 | 1/2001 | Bennett .................... 341/175 |
| 6,191,709 B1 | 2/2001 | Cho .......................... 341/26 |
| 6,438,699 B1 * | 8/2002 | Cato et al. ................ 713/323 |
| 6,625,739 B1 * | 9/2003 | Kobayashi ................ 713/310 |

* cited by examiner

KEY INPUT CIRCUIT, POWER SUPPLY CONTROL APPARATUS, AND POWER SUPPLY CONTROL METHOD

BACKGROUND OF THE INVENTION

The present invention is generally related to a power supply control apparatus and a power supply control method for use in portable electronic equipments driven by a battery. More specifically, the present invention is directed to a key input circuit, a power supply control apparatus, and a power supply control method for use in portable electronic equipments, in which a power supply control key is provided with a key switch formed by arranging a plurality of key contacts at cross points of a key matrix, a hardware size is suppressed, and a software processing sequence used to detect a depression of a key is made simple.

In a conventional power supply control apparatus, a key switch for controlling a supply of electric power is realized by a power supply control key which is arranged independently from a key matrix. When the power supply is turned ON, since this power supply control key is depressed, the power supply is directly controlled so as to commence supplying of the electric power. Also, when the power supply is turned OFF, supplying of the electric power is stopped by interrupting a process operation executed by a processing apparatus (CPU etc.), and by detecting a key depression (by monitoring key state) executed by the processing apparatus (CPU etc.) via an I/O port.

However, the power supply control key used to instruct the power supply control of the power supply and also the key matrix for entering the key operation are independently arranged in the above-explained conventional power supply control apparatus. Since the key input directed to the power supply control and the key input directed to the key input operation are detected by the other circuits, there is such a problem. That is, the processing systems would become complex, and thus, the overall hardware size of the power supply control apparatus is increased.

Also, since the key depression detecting procedure for entering the key operation is required independent from the depression detection procedure of the power supply control key, there is another problem that the software processing procedure used to detect the key depression detection would become complex.

SUMMARY OF THE INVENTION

The present invention has been made to solve the above-explained conventional problems, and therefore, has an object to provide a key input circuit, a power supply control apparatus, and a power supply control method for a portable electronic equipments, in which a power supply control key is provided with a key switch formed by arranging a plurality of key contacts at cross points of a key matrix, a hardware size is suppressed, and a software processing sequence used to detect a depression of a key is made simple.

To solve the above-described problems, a key input circuit for a portable electronic equipments, according to the first aspect of the present invention, comprises: a key switch formed by arranging a plurality of key contacts at cross points of a key matrix, and equipped with one of the plural key contacts as a power supply control key; a key scan circuit for detecting open/close states of the plural key contacts of the key switch; and power supply control key state detecting means for detecting an open/close state of a contact of the power supply control key independent from the open/close state detection by the key scan circuit.

Preferably, in the key input circuit, the key scan circuit may include: scanning means for scanning any one of a row and a column of the key matrix by way of a binary logic signal; and key state detecting means for acquiring the binary logic signal of the scanning means via the key matrix, and for separately detecting the open/close states of the plurality of key contacts based upon the logic value of the acquired binary logic signal.

According to the second aspect of the present invention, a power supply control apparatus for a portable electronic equipments comprises: a key switch formed by arranging a plurality of key contacts at cross points of a key matrix, and equipped with one of the plural key contacts as a power supply control key; a key scan circuit for detecting open/close states of the plural key contacts of the key switch; power supply control key state detecting means for detecting an open/close state of a contact of the power supply control key independent from the open/close state detection by the key scan circuit; and a power supply for commencing a supply of electric power in such a case that the close state of the contact of the power supply control key is detected by the power supply control key state detecting means; and processing means for stopping the supply of the electric power from the power supply in the case that the close state of the contact of the power supply control key is detected by the key scan circuit.

Preferably, in the power supply control apparatus, the key scan circuit may include: scanning means for scanning any one of a row and a column of the key matrix by way of a binary logic signal; and key state detecting means for acquiring the binary logic signal of the scanning means via the key matrix, and for separately detecting the open/close states of the plurality of key contacts based upon the logic value of the acquired binary logic signal.

According to third aspect of the present invention, a power supply control method for a power supply control apparatus of a portable electronic equipment comprising; a key switch formed by arranging a plurality of key contacts at cross points of a key matrix, and equipped with one of the plural key contacts as a power supply control key; a key scan circuit for detecting open/close states of the plural key contacts of the key switch; power supply control key state detecting means for detecting an open/close state of a contact of the power supply control key independent from the open/close state detection by the key scan circuit; and a power supply; the power supply control method is comprised of: a power supply starting step for starting a supply of electric power in such a case that the close state of the contact of the power supply control key is detected by the power supply control key state detecting means; and a power supply stopping step for stopping the supply of the electric power from the power supply in the case that the close state of the contact of the power supply control key is detected by the key scan circuit.

Preferably, in a power supply control method, the detection of the close state of the contact of the power supply control key by the key scan circuit at the power supply stopping step includes: a scanning step for scanning any one of a row and a column of the key matrix by way of a binary logic signal; and a key state detecting step for acquiring the binary logic signal of the scanning means via the key matrix, and for separately detecting the open/close states of the plurality of key contacts based upon the logic value of the acquired binary logic signal.

In the key input circuit, according to the first aspect of the present invention, the key switch formed by arranging a plurality of key contacts at the cross points of the key matrix is provided with the power supply control key; and the key scan circuit for detecting the open/close states of the plural key contacts of the key switch is independently arranged from the power supply control key state detecting means for detecting the open/close state of the contact of the power supply control key. For instance, the following control operation is carried out in such a manner that when the power supply is turned ON, the depression of the power supply control key is detected by the power supply control key state detecting means, and the power supply is directly controlled by this detection signal so as to commence the supply of the electric power. When the operation is ended, or the power supply is turned OFF, the depression of the power supply control key is detected by the key scan circuit, and the supply of the electric power is stopped by way of a process means of an apparatus to which this key input circuit is applied.

As previously explained, since the power supply control key for instructing the supply control of the electric power is arranged within the key matrix for the operation input in an integral manner, the total hardware amount can be suppressed without making the key input detecting circuit complex. Also, since the depression detecting procedure of the power supply control key can be carried out in accordance with the same procedure as the key depression detecting procedure for the operation input, the software processing procedure for detecting the key depression can be made simple.

More specifically, it is desirable in the key input circuit that in the key scan circuit, the scanning means scans any one of the row and the column of the key matrix by way of the binary logic signal, and the key state detecting means acquires the binary logic signal of the scanning means via the key matrix, and separately detects the open/close states of the plurality of key contacts based upon the logic value of the acquired binary logic signal.

Further, in accordance with the power supply control apparatus and the power supply control method according to the second and third aspects of the present invention, the key switch formed by arranging a plurality of key contacts at the cross points of the key matrix is provided with the power supply control key; and the key scan circuit for detecting the open/close states of the plural key contacts of the key switch is independently arranged from the power supply control key state detecting means for detecting the open/close state of the contact of the power supply control key. When the power supply is turned ON (power supply starting step), the depression of the power supply control key (close state of contact of power supply control key) is detected by the power supply control key state detecting means. The power supply is directly controlled based upon the detection signal so as to start the supply of the electric power from this power supply. When either the operation is accomplished or the power supply is turned OFF (power supply stopping step), the depression of the power supply control key (close state of contact of power supply control key) is detected by the key scan circuit, and then the supply of the electric power from the power supply is stopped by the processing means employed in this power supply control apparatus.

As previously explained, since the power supply control key for instructing the supply control of the electric power is arranged within the key matrix for the operation input in an integral manner, the total hardware amount can be suppressed without making the key input detecting circuit complex. Also, since the depression detecting procedure of the power supply control key can be carried out in accordance with the same procedure as the key depression detecting procedure for the operation input, the software processing procedure for detecting the key depression can be made simple.

In particular, it is so desirable in the power supply control and the power supply control method that in the key scan circuit (detection of close state of power supply control key contact by key scan circuit at power supply stopping step), the scanning means (scanning step) scans any one of the row and the column of the key matrix by way of the binary logic signal; and the key state detecting means (key state detecting step) acquires the binary logic signal of the scanning means via the key matrix, and separately detects the open/close states of the plurality of key contacts based upon the logic value of the acquired binary logic signal.

DETAILED DESCRIPTION OF THE PREFERRED EMBODIMENTS

Referring now to drawings, preferred embodiments will be described in detail.

First Embodiment

Figure 1:
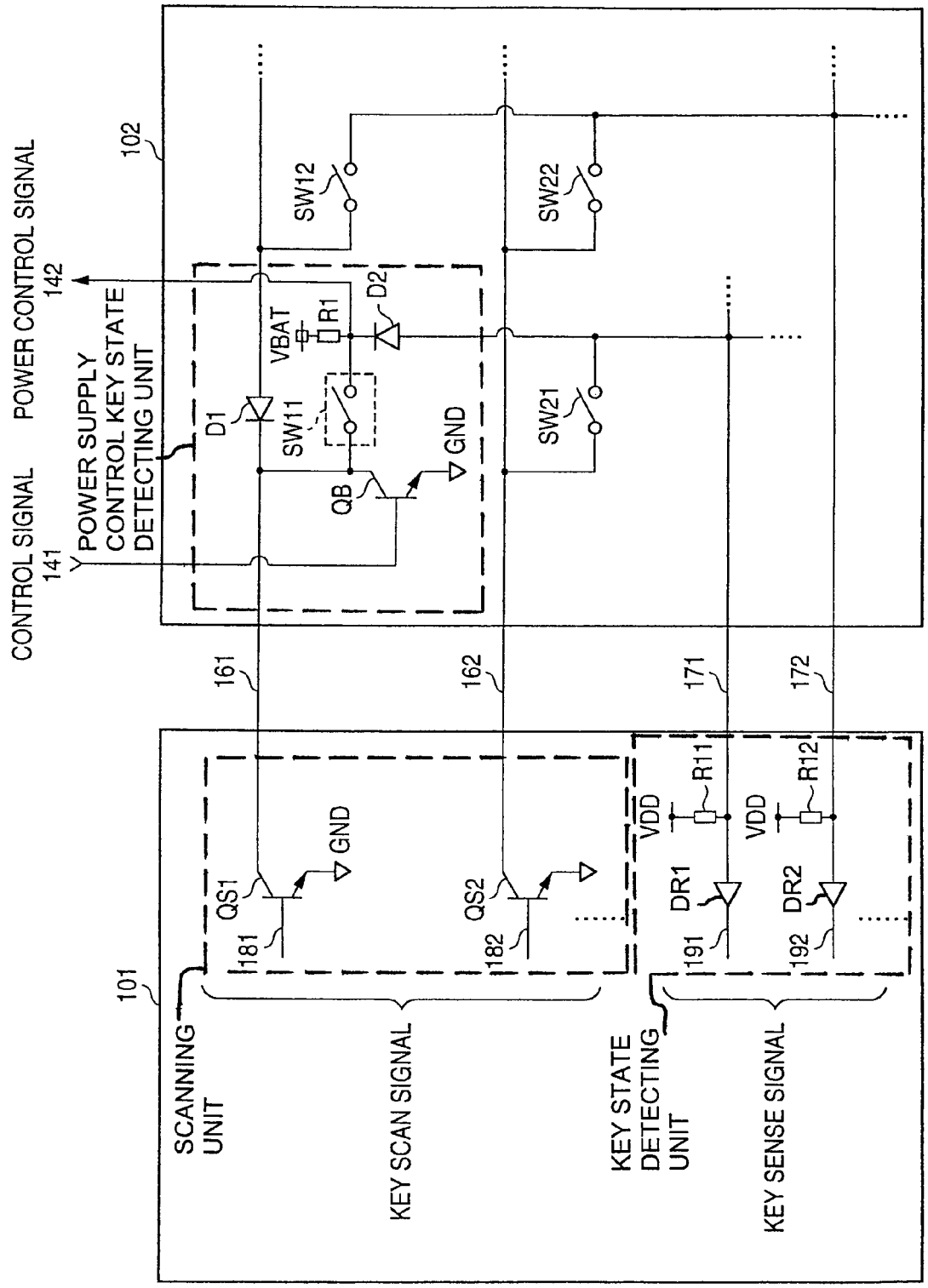
FIG. 1 is a structural diagram of a key input circuit according to a first embodiment mode of the present invention.

FIG. 1 is a structural diagram of a key input circuit for portable electronic equipment such as portable phone and a personal digital assistant, according to a first embodiment of the present invention.

In this drawing, the key input circuit of this embodiment mode is arranged by employing a key switch 102 and a key scan circuit 101. The key switch 102 is formed by arranging a plurality of key contacts SW11, SW12, SW21, SW 22, . . . , at cross points of a key matrix, and any one of these plural key contacts is provided as a power supply control key (SW11). The key scan circuit 101 detects open/close states of the plural key contacts SW11, SW12, . . . , of the key switch 102.

The key scan circuit 101 is arranged by employing both a scanning unit and a key state detecting unit. The scanning unit scans a row of a key matrix of the key switch 102 based upon binary logic signals 161, 162, . . . . The binary logic signals 161, 162, . . . , are produced as collector outputs of transistors QS1, QS2, . . . , and are connected to one terminal of each of the plural key contacts SW11, SW12, SW21, SW22, . . . , of the key matrix. The transistors QS1, QS2, . . . , are turned ON in the case that the key scan signals 181, 182, . . . , are inputted to the bases thereof and these key scan signals 181, 182, . . . , own "H" levels.

Also, the key state detecting unit acquires the binary logic signals 161, 162, . . . , supplied from the scanning unit via the key matrix of the key switch 102 so as to separately detect the open/close states of the plurality key contacts SW11, SW12, SW21, SW22, . . . , based upon logic values of signals 171, 172, . . . . In other words, the signals 171, 172, . . . , which are connected to other terminals of the plural key contacts SW11, SW12, SW21, SW22, . . . , of the key matrix are acquired via driver circuits DR1, DR2, . . . , as key sense signals 191, 192, . . . It should be noted that the signals 171, 172, . . . are pulled up via resistors R11, R12, . . . , to the power supply potential $V_{DD}$.

Also, as a power supply control key state detecting unit for detecting the open/close state of the contact SW 11 of the power supply control key provided in the key matrix of the key switch 102, a transistor QB, a resistor R1, and diodes D1 and D2 are added to this contact SW11. A control signal 141 is entered to abase of this transistor QB, a collector output of the transistor QB is connected to one terminal of the contact SW11, and this transistor QB is turned ON when the level of the control signal 141 becomes an "H" level. A potential appearing at the other terminal of the contact SW11 when the transistor QB is turned ON is sensed by a power supply control signal 142, so that this power supply control key state detecting unit can detect the open/close state of the contact SW11, which is carried out independently from that of the key scan circuit 101.

It should be noted that the power control signal 142 is pulled up via a resistor R1 to a cell potential $V_{BAT}$. In this case, the cell potential $V_{BAT}$ corresponds to an output of a cell equipped with an apparatus to which this key input circuit of the embodiment mode is applied, and the above-explained power supply potential $V_{DD}$ corresponds to a power supply output which is produced by a power supply of a regulator and the like based upon this cell output. In other words, the cell potential $V_{BAT}$ is continuously applied until the cell lifetime is accomplished. To the contrary, the power supply potential $V_{DD}$ is applied when the operation is ended, or the power supply is turned OFF.

Also, the diodes D1 and D2 are employed in order that the power supply control key state detecting unit may be independently operated with respect to the key scan circuit 101 in a separate manner. In other words, the diodes D1 and D2 are employed so as not to apply the cell potential $V_{BAT}$ to the key sense signals 171 and 172, which are pulled up to the power supply potential $V_{DD}$.

Next, operations of the key input circuit with employment of the above-explained circuit arrangement, according to this embodiment mode, will now be described. As previously described, it is now assumed that the apparatus to which the key input circuit of this embodiment mode is applied is equipped with the cell (battery) for outputting the cell potential $V_{BAT}$ and also the power supply such as the regulator for producing the power supply potential $V_{DD}$ based upon the output of this cell in addition to a control unit for controlling this power supply and furthermore, a control circuit unit driven by this cell potential $V_{BAT}$, and the control signal 141 supplied from either this control unit or the control circuit unit is pulled up to the cell potential $V_{BAT}$.

First, when the power supply is turned ON, a user of this apparatus depresses the power supply control key (SW11) so as to initiate this apparatus. At this time, the depression of the power supply control key (SW11) is detected by the power supply control key state detecting unit.

In other words, under the condition of this power supply control key state detecting unit before the power supply control key (SW11) is depressed, both the control signal 141 and the power supply control signal 142 are pulled up to the cell potential $V_{BAT}$; the "H"-leveled signal is supplied to the base of the transistor QB so that the transistor QB is brought into the ON state; and a potential at one terminal of the contact SW11 becomes the ground potential GND. When the power supply control key (SW11) is depressed under this condition, a potential at the other terminal of the contact SW11, namely the level of the power supply control signal 142 is transferred from the "H" level to the "L" level. This level change is acquired to be sensed by the control circuit unit driven by the cell potential $V_{BA}$, and the control circuit unit directly control the power supply so as to commence the supply of the electric power to the apparatus.

Next, when the operation of the apparatus is ended, or the power supply is turned OFF, the user of this apparatus depresses the power supply control key (SW11) so as to turn OFF the apparatus. At this time, the depression of the power supply control key (SW11) is detected by the key scan circuit 101. When the apparatus is set under the operation condition, the control unit performs a so-called normal scanning operation. That is, the control unit supplies the key scan signals 181, 182, . . . , to the scanning unit of the key scan circuit 101, and detects the depress/release states of the key contacts SW11, SW12, SW21, SW22, . . . , by acquiring the key sense signal derived from the key scan signals 181, 182, . . . . These key contacts SW11, SW12, SW21, SW 22, . . . , are arranged on the key matrix of the key switch 102.

As a consequence, since the power supply control key (SW11) is arranged in the key matrix of the key switch 102 in the key input circuit of this embodiment mode, the depression of the power supply control key (SW11) under such a condition that the apparatus is brought into the operation condition is detected by the key scan circuit 101. At this time, the control unit performs such a control operation that the supply of the electric power to the apparatus is stopped by executing the apparatus turn-OFF process operation in the form of the computer program in connection with the depression of the power supply control key (SW11).

As previously described, in the key input circuit according to this embodiment mode, the key switch 102 formed by arranging a plurality of key contacts SW11, SW12, SW21, SW22, . . . , at the cross points of the key matrix is provided with the power supply control key (SW11); and the key scan circuit 101 for detecting the open/close states of the plural key contacts of the key switch 102 is independently arranged from the power supply control key state detecting unit for detecting the open/close state of the contact SW11 of the power supply control key. As a result, the key input circuit of this embodiment mode can perform the following control operation. For instance, when the power supply is turned ON, the depression of the power supply control key (SW11) is detected by the power supply control key state detecting unit, and the power supply is directly controlled by this detection signal so as to commence the supply of the electric power. When the operation is ended, or the power supply is turned OFF, the depression of the power supply control key (SW11) is detected by the key scan circuit, and the supply of the electric power is stopped by way of the control unit of the apparatus to which this key input circuit.

In other words, in the key input circuit of this embodiment mode, since the power supply control key (SW11) for instructing the supply control of the electric power is arranged within the key matrix for the operation input in an integral manner, the total hardware amount can be suppressed without making the key input detecting circuit complex. Also, since the depression detecting procedure of the power supply control key can be carried out in accordance with the same procedure as the key depression detecting procedure for the operation input, the software processing procedure for detecting the key depression can be made simple.

Second Embodiment

Figure 2:
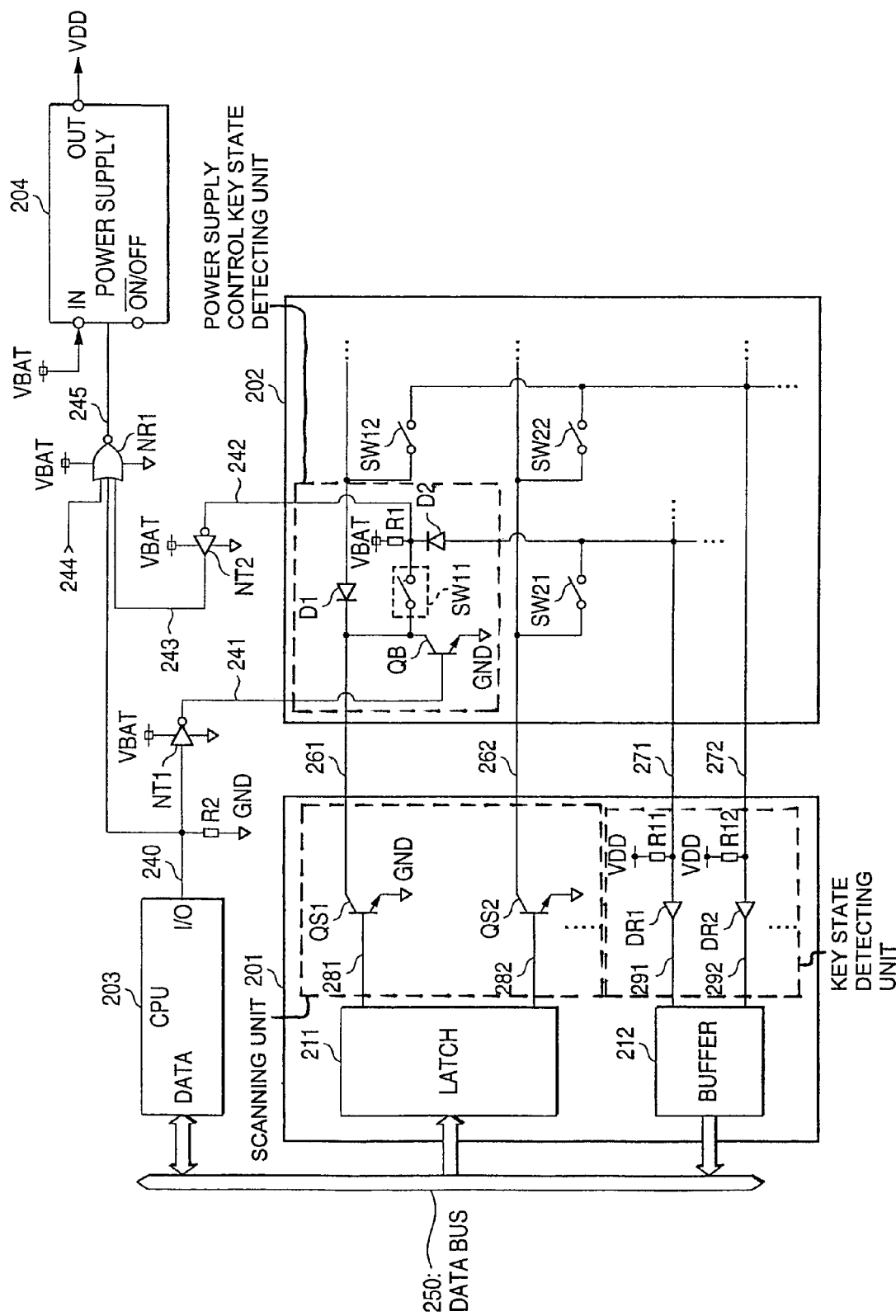
FIG. 2 is a structural diagram of a power supply control apparatus according to a second embodiment mode of the present invention.

FIG. 2 is a structural diagram of a power supply control apparatus for use in a portable electronic equipment such as portable phone and PAD, according to a second embodiment mode of the present invention, to which a power supply control method of the present invention is applied.

In this drawing, the power supply control apparatus, according to this embodiment mode, is arranged by a key switch 202, a key scan circuit 201, a CPU 203, and a power supply 204. The key switch 202 is formed by arranging a plurality of key contacts SW11, SW12, SW21, SW22, . . . , at cross points of a key matrix, and any one of these plural key contacts is provided as a power supply control key (SW11). The key scan circuit 201 detects open/close states of the plural key contacts SW11, SW12, . . . , of the key switch 202.

In this embodiment, the key scan circuit 201 is arranged by a latch 211, a scanning unit, a buffer 212, and a key state detecting unit.

The latch 211 is connected via a data bus 250 to the CPU 203. When a key scanning operation is carried out by the key scan circuit 201, this latch 211 outputs key scan signals 281, 282, . . . , to the scanning unit based upon the scan data supplied from the CPU 203.

The scanning unit scans a row of a key matrix of the key switch 202 based upon binary logic signals 261, 262, . . . . The binary logic signals 261, 262, . . . , are produced as collector outputs of transistors QS1, QS2, . . . , and are connected to one terminal of each of the plural key contacts SW11, SW12, SW21, SW22, . . . , of the key matrix. The transistors QS1, QS2, . . . , are turned ON in the case that key scan signals 281, 282, . . . , are inputted to the bases thereof and these key scan signals 281, 282, . . . , own "H" levels.

Also, the key state detecting unit acquires the binary logic signals 261, 262, . . . , supplied from the scanning unit via the key matrix of the key switch 202 so as to separately detect the open/close states of the plurality key contacts SW11, SW12, SW21, SW22, . . . , by any sense signals 291, 292, . . . , corresponding to outputs of drover circuits DR1, DR2, . . . , based upon logic values of signals 271, 272, . . . . It should be noted that the signals 271, 272, . . . are pulled up via resistors R11, R12, . . . , to the power supply potential $V_{DD}$.

Furthermore, the buffer 212 outputs the key sense signals 291, 292, . . . , from the driver circuit DR1, DR2, . . . , via a data bus 250 to the CPU 203. The CPU 203 can separately detect open/close states of the plural key contacts SW11, SW12, SW21, SW22, . . . , of the key matrix of the key switch 202 by sense data produced based on the key sense signals 291, 292, . . . .

As previously described, the CPU 203 outputs the scan data to the latch 211 of the key scan circuit 201 as the normal key scan operation so as to acquire the sense data from the buffer 212 of the key scan circuit 201. As a result, this CPU 203 can separately detect the open/close states of the plural key contacts SW11, SW12, SW21, SW22, . . . , of the key matrix of the key switch 202.

Also, in the case that the CPU 203 detects the close state (depression) of the contact SW11 of the power supply control key by executing this key scanning operation, the CPU 203 brings a power supply holding request signal 240 into a non-active state ("L" level) in order to stop outputting of the power supply potential $V_{DD}$ of the power supply 204. In other words, since the power supply holding request signal 240 is set to the "L" level, a power supply ON/OFF control signal 245 corresponding to an output of a NOR gate NR1 becomes the non-active state ("L" level), so that the power supply 204 is brought into such an OFF state that applying of the power supply potential $V_{DD}$ is stopped.

Also, as a power supply control key state detecting unit for detecting the open/close states (depression and release) of the contact SW11 of the power supply control key provided in the key matrix of the key with 202, a transistor QB, a resistor RT1, and diodes D1 and D2 are added to the contact SW11. A control signal 141 corresponding to an output of a NOT gate NT1 is entered to abase of this transistor QB, a collector output of the transistor QB is connected to one terminal of the contract SW11, and this transistor QB is turned ON when the level of the control signal 241 becomes an "H" level. A potential appearing at the other terminal of the contact SW11 when the transistor QB is turned ON is sensed by a power supply control signal 242, so that this power supply control key state detecting unit can detect the open/close state of the contact SW11, which is carried out independently from that of the key scan circuit 201.

It should be noted that the power control signal 242 is pulled up via a resistor R1 to a cell potential $V_{BAT}$. Also, the diodes D1 and D2 are employed in order that the power supply control key state detecting unit may be independently operated with respect to the key scan circuit 201 in a separate manner. In other words, the diodes D1 and D2 are employed so as not to apply the cell potential $V_{BAT}$ to the key sense signals 171 and 172, which are pulled up to the power supply potential $V_{DD}$. Also, the NOT gate NT1 is driven by the cell potential $V_{BAT}$, and the power supply holding request signal 240 corresponding to the input of the NOT gate NT1 is pulled down via a resistor R2 to the ground potential GND. As a result, when the power supply 204 is not yet turned ON, namely is set to an OFF state, the level of the control signal 241 is maintained at an "H" level, so that the open/close states of the contact SW11 can be detected by the power supply control key state detecting unit.

Furthermore, the power supply 204 starts the supply of the electric power in such a case that the power supply control key state detecting unit detects the close state of the contact SW11 of the power supply control key. In other words, when the power supply control key state detecting unit detects the close state of the contact SW11 of the power supply control key, since the signal level of the power supply control signal 242 is at an "L" level, a power supply control key-ON signal 243 corresponding to an output of a NOT gate NT2 is brought into an active state ("H" level), and also a power supply ON/OFF control signal 245 corresponding to an output of a NOR gate NR1 is brought into an active state ("L" level). As a result, the power supply 204 is brought into such an ON state that the supply of the power supply potential $V_{DD}$ is carried out based upon the entered cell potential $V_{BAT}$.

In this case, the cell potential $V_{BAT}$ corresponds to the output of the cell equipped with this power supply control apparatus. As a consequence, the cell potential $V_{BA}$ is continuously supplied until the lifetime of this cell is ended. To the contrary, the power supply potential $V_{DD}$ is applied from the turn-ON of the power supply until the operation is accomplished, or when the power supply is turned OFF. It should also be noted that since both the NOT gate NT2 and the NOR gate NR1 are driven by the cell potential $V_{BAT}$, when the power supply 204 is brought into the OFF state, the ON-control of the power supply 204 can be carried out by the hardware sequences of the power supply control key state detecting unit, and both the NOT gate NT2 and the NOR gate NR1. Also, both the power supply holding request signal 240 and the power supply control key-ON signal 243 are inputted in addition to another power supply ON-request signal 243 to the NOR gate NR1 which produces the power supply ON/OFF-control signal 245 by the OR-gating operation.

Next, a description will now be made of the operation of the power supply control apparatus equipped with the above-explained arrangement, according to this embodiment mode, namely the power supply control method. In this case, the following cases will be explained, namely in the case that the depression of the power supply control key (SW11) is detected by either the key scan circuit 201 or the power supply control key state detecting unit, and then the power supply 204 is turned ON (supply of power supply potential $V_{DD}$ is performed), and in such a case that the depression of the power supply control key (SW11) is detected by either the key scan circuit 201 or the power supply control key state detecting unit, and then the power supply 204 is turned OFF (supply of power supply potential $V_{DD}$ is stopped).

First, in such a case that although the cell is connected so as to supply the cell potential $V_{BAT}$ to the power supply control apparatus, the power supply 204 thereof is turned OFF, the power supply control signal 242 derived from the power supply control key state detecting unit is under non-active state ("H" level), and also the power supply control key-ON signal 243 is under non-active state ("L" level). At this time, since the power supply holding request signal 240 and another power supply ON-request signal 244 are under non-active states ("L" levels), the power supply ON/OFF control signal 245 is maintained under non-active state ("H" level).

Now, a description will be made of a power supply starting step (defined in claim) at which the power supply is turned ON under such a condition. In this case, the user of the power supply control apparatus depresses the power supply control key (SW11) so as to initiate this power supply control apparatus, and the depression of the power supply control key (SW11) is detected by the power supply control key state detecting unit. In other words, when the power supply control key (SW11) is depressed, the power supply control signal 242 is brought into the non-active state ("L" level) by way of the transistor QB under ON state, so that the power supply control key-ON signal 243 is also brought into the active state ("H" level). As a consequence, the state of the power supply ON/OFF control signal 245 is changed into the active state ("L" level), and the power supply 204 is brought into the ON state, so that the supply of the power supply potential $V_{DD}$ is commenced.

Since the power supply 204 is brought into the ON state, the CPU 203 starts its operation and executes the software process operation, so that the power supply holding request signal 240 is brought into the active state ("H" level). As a result, even in such a case that the power supply control key (SW11) is released to bright the power supply control key-ON signal 243 into the non-active state ("L" level), the power supply ON/OFF control signal 245 can be maintained under active state ("L" level). At the same time, the normal key scanning operation can be carried out by turning OFF the transistor QB so as to connect the key scan signals 281, 282, ..., to the key sense signals 291, 292, ....

Also, when the power supply holding request signal 240 is under active state ("H" level) and the power supply 204 is maintained under ON state, both the depression and the release of the power supply control key (SW11) arranged at the key matrix of the key switch 202 can be detected by performing the normal key scan operation.

A power supplying step defined in claim is carried out as follows: That is to say, in the case that the depression of the power supply control key (SW11) is detected by way of the key scan operation for a continuous time period such as 2 to 3 seconds, the CPU 203 judges that the operation is accomplished, or the power supply is turned OFF in order to turn OFF the power supply 204. As a consequence, the CPU 203 executes the software control to delete the LCD displayed content of the power supply control apparatus in order to prompt the release of the power supply control key (SW11). Thereafter, this CPU 203 changes the state of the power supply holding request signal 240 to the non-active state ("L" level). Thereafter, when the power supply control key (SW11) is released, the power supply control key-ON signal 243 is brought into the non-active state ("L" level), and thus the level of the power ON/OFF control signal 245 is changed into the active state ("L" level). As a result, the power supply 204 can be brought into the OFF state.

As previously described, in accordance with the power supply control apparatus and the power supply control method of this embodiment mode, the key switch 202 formed by arranging a plurality of key contacts SW11, SW12, SW21, SW22, ..., at the cross points of the key matrix is provided with the power supply control key (SW11). Since the key scan circuit 201 for detecting the open/close states of the plural key contacts of the key switch 202 is independently arranged from the power supply control key state detecting means for detecting the open/close state of the contact SW11 of the power supply control key, when the power supply is turned ON (power supply starting step), the depression of the power supply control key (SW11) is detected by the power supply control key state detecting means. The power supply 204 is directly controlled based upon the detection signal so as to start the supply of the electric power from this power supply 204. When either the operation is accomplished or the power supply is turned OFF (power supply stopping step), the depression of the power supply control key (SW11) is detected by the key scan circuit 201, and then the supply of the electric power from the power supply is stopped by the CPU 203.

In other words, in the power supply control apparatus, and the power supply control method of this embodiment mode, since the power supply control key (SW11) for instructing the supply control of the power supply 204 is arranged within the key switch 201 (key matrix) for the operation input in an integral manner, the depression of the power supply control key need not be handled as a interrupt factor of the CPU. Also, the CPU interrupt signal used to control the depression detection of the power supply control key and also the hardware resource such as the I/O port for monitoring the state can be reduced. As a result, the total hardware amount can be suppressed without making the key input detecting circuit complex. Also, since the depression detecting procedure of the power supply control key (SW11) can be carried out in accordance with the same procedure as the key depression detecting procedure for the operation input, the software processing procedure for detecting the key depression can be made simple.

As previously explained, in accordance with the key input circuit of the present invention, the key switch formed by arranging a plurality of key contacts at the cross points of the key matrix is provided with the power supply control key, and the key scan circuit for detecting the open/close states of the plural key contacts of the key switch is independently arranged from the power supply control key state detecting means for detecting the open/close state of the contact of the power supply control key. For instance, the following control operation is carried out in such a manner that when the power supply is turned ON, the depression of the power supply control key is detected by the power supply control key sate detecting means, and the power supply is directly controlled by this detection signal so as to commence the supply of the electric power. When the operation is ended, or the power supply is turned OFF, the depression of the power supply control key is detected by the key scan circuit, and the supply of the electric power is stopped by way of the process means of the apparatus to .which this key input circuit is applied. As a result, the total hardware amount can be suppressed without making the key input detecting circuit complex. Also, since the depression detecting procedure of the power supply control key can be carried out in accordance with the same procedure as the key depression detecting procedure of the operation input, the key input circuit can be provided by which the software processing procedure for detecting the key depression can be made simple.

Also, in accordance with the power supply control apparatus and the power supply control method of the present invention, the key switch formed by arranging a plurality of key contacts at the cross points of the key matrix is provided with the power supply control key, and the key scan circuit for detecting the open/close states of the plural key contacts of the key switch is independently arranged from the power supply control key state detecting means for detecting the open/close state of the contact of the power supply control key. When the power supply is turned ON (power supply starting step), the depression of the power supply control key (close state of contact of power supply control key) is detected by the power supply control key state detecting means. The power supply is directly controlled based upon the detection signal so as to start the supply of the electric power from this power supply. When either the operation is accomplished or the power supply is turned OFF (power supply stopping step), the depression of the power supply control key (close state of contact of power supply control key) is detected by the key scan circuit, and then the supply of the electric power from the power supply is stopped by the processing means employed in this power supply control apparatus. As a result, the total hardware amount can be suppressed without making the key input detecting circuit complex. Also, since the depression detecting procedure of the power supply control key can be carried out in accordance with the same procedure as the key depression detecting procedure for the operation input both the power supply control apparatus and the power supply control method can be provided by which the software processing procedure for detecting the key depression can be made simple.

What is claimed:

1. A key input circuit for a portable electronic equipment comprising:
    a power supply control key;
    a key switch formed by arranging a plurality of key contacts at cross points of a key matrix, and equipped with one of said plural key contacts as a power supply control key contact of said power supply control key;
    a key scan circuit for detecting open/close states of said plural key contacts of said key switch including said power supply control key contact; and
    power supply control key state detecting means for detecting an open/close state of said power supply control key contact independent from the open/close state detection by said key scan circuit.

2. A key input circuit as claimed in claim 1, wherein said key scan circuit includes:
    scanning means for scanning any one of a row and a column of said key matrix by way of a binary logic signal; and
    key state detecting means for acquiring said binary logic signal of said scanning means via said key matrix, and for separately detecting the open/close states of said plurality of key contacts based upon the logic value of said acquired binary logic signal.

3. The key input circuit as claimed in claim 1, wherein said power supply control key state detecting means detects said open/close state of said power supply control key contact via one current path through said power supply control key contact, and wherein said key scan circuit detects said open/close state of said power supply control key contact via another current path through said power supply control key contact.

* * * * *